United States Patent
Camillo-Castillo et al.

(10) Patent No.: US 8,716,837 B2
(45) Date of Patent: May 6, 2014

(54) BIPOLAR JUNCTION TRANSISTORS WITH A LINK REGION CONNECTING THE INTRINSIC AND EXTRINSIC BASES

(71) Applicant: International Business Machines Corporation, Armonk, NY (US)

(72) Inventors: Renata Camillo-Castillo, Essex Junction, VT (US); Peter B. Gray, Jericho, VT (US); David L. Harame, Essex Junction, VT (US); Alvin J. Joseph, Williston, VT (US); Marwan H. Khater, Astoria, NY (US); Qizhi Liu, Waltham, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/758,204

(22) Filed: Feb. 4, 2013

(65) Prior Publication Data
US 2013/0147017 A1    Jun. 13, 2013

Related U.S. Application Data

(62) Division of application No. 13/177,146, filed on Jul. 6, 2011.

(51) Int. Cl.
*H01L 21/02* (2006.01)
*H01L 21/331* (2006.01)

(52) U.S. Cl.
USPC .......................................... 257/586; 438/349

(58) Field of Classification Search
USPC .......... 438/317–319, 343, 349; 257/198, 586, 257/E29.045, E29.114
See application file for complete search history.

(56) References Cited

U.S. PATENT DOCUMENTS

| | | | |
|---|---|---|---|
| 4,484,244 | A | 11/1984 | Avery |
| 4,885,614 | A | 12/1989 | Furukawa et al. |
| 5,242,843 | A | 9/1993 | Aina |
| 5,780,905 | A | 7/1998 | Chen et al. |
| 6,011,681 | A | 1/2000 | Ker et al. |
| 6,258,634 | B1 | 7/2001 | Wang et al. |
| 6,365,924 | B1 | 4/2002 | Wang et al. |
| 6,531,369 | B1 | 3/2003 | Ozkan et al. |
| 6,566,273 | B2 | 5/2003 | Kudelka |
| 6,750,484 | B2 | 6/2004 | Lippert et al. |

(Continued)

OTHER PUBLICATIONS

Korean Intellectual Property Office, Notification of Transmittal of the International Search Report and the Written Opinion of the International Searching Authority issued in international application No. PCT/US2012/043443 dated Jan. 7, 2013.

(Continued)

*Primary Examiner* — Calvin Lee
(74) *Attorney, Agent, or Firm* — Wood, Herron & Evans LLP; Anthony J. Canale

(57) ABSTRACT

Methods for fabricating bipolar junction transistors, bipolar junction transistors made by the methods, and design structures for a bipolar junction transistor. The bipolar junction transistor includes a dielectric layer on an intrinsic base and an extrinsic base at least partially separated from the intrinsic base by the dielectric layer. An emitter opening extends through the extrinsic base and the dielectric layer. The dielectric layer is recessed laterally relative to the emitter opening to define a cavity between the intrinsic base and the extrinsic base. The cavity is filled with a semiconductor layer that physically links the extrinsic base and the intrinsic base together.

20 Claims, 13 Drawing Sheets

(56) References Cited

U.S. PATENT DOCUMENTS

| | | | |
|---|---|---|---|
| 6,767,798 B2 | 7/2004 | Kalnitsky et al. | |
| 6,784,029 B1 | 8/2004 | Vashchenko et al. | |
| 6,809,024 B1 | 10/2004 | Dunn et al. | |
| 6,812,545 B2 | 11/2004 | Dunn et al. | |
| 6,864,560 B2 | 3/2005 | Khater et al. | |
| 6,869,852 B1 | 3/2005 | Joseph et al. | |
| 6,888,221 B1 | 5/2005 | Joseph et al. | |
| 6,906,357 B1 | 6/2005 | Vashchenko et al. | |
| 6,933,540 B2 | 8/2005 | Liu et al. | |
| 6,936,910 B2 | 8/2005 | Ellis-Monaghan et al. | |
| 6,940,149 B1 | 9/2005 | Divakaruni et al. | |
| 6,960,792 B1 | 11/2005 | Nguyen | |
| 6,964,883 B2 | 11/2005 | Chang | |
| 6,964,907 B1 | 11/2005 | Hopper et al. | |
| 6,972,443 B2 * | 12/2005 | Khater | 257/197 |
| 7,002,221 B2 | 2/2006 | Khater et al. | |
| 7,019,341 B2 | 3/2006 | Lippert et al. | |
| 7,034,363 B2 | 4/2006 | Chen | |
| 7,087,940 B2 | 8/2006 | Khater et al. | |
| 7,145,187 B1 | 12/2006 | Vashchenko et al. | |
| 7,196,361 B1 | 3/2007 | Vashchenko et al. | |
| 7,253,096 B2 | 8/2007 | Khater et al. | |
| 7,262,484 B2 | 8/2007 | Dunn et al. | |
| 7,327,541 B1 | 2/2008 | Wang et al. | |
| 7,371,650 B2 | 5/2008 | Bock et al. | |
| 7,394,133 B1 | 7/2008 | Vashchenko et al. | |
| 7,427,787 B2 | 9/2008 | Steinhoff | |
| 7,462,547 B2 | 12/2008 | Akatsu et al. | |
| 7,489,359 B2 | 2/2009 | Fukumoto et al. | |
| 7,566,914 B2 | 7/2009 | Salcedo et al. | |
| 7,612,430 B2 | 11/2009 | Franosch et al. | |
| 7,639,464 B1 | 12/2009 | Vashchenko et al. | |
| 7,719,088 B2 | 5/2010 | Bock et al. | |
| 7,776,704 B2 | 8/2010 | Dunn et al. | |
| 7,842,971 B2 | 11/2010 | Liu et al. | |
| 7,888,745 B2 | 2/2011 | Khater et al. | |
| 7,915,638 B2 | 3/2011 | Tseng et al. | |
| 7,932,541 B2 | 4/2011 | Joseph et al. | |
| 7,936,030 B2 | 5/2011 | Kim et al. | |
| 7,995,316 B2 | 8/2011 | Carpenter, Jr. et al. | |
| 8,035,190 B2 | 10/2011 | Liu et al. | |
| 8,039,868 B2 | 10/2011 | Gauthier, Jr. et al. | |
| 8,101,491 B2 | 1/2012 | Donkers et al. | |
| 8,536,012 B2 * | 9/2013 | Camillo-Castillo | 438/349 |
| 2002/0090788 A1 | 7/2002 | U'ren | |
| 2002/0117733 A1 | 8/2002 | Racanelli | |
| 2003/0064555 A1 | 4/2003 | Ahlgren et al. | |
| 2004/0110354 A1 | 6/2004 | Natzle et al. | |
| 2004/0188797 A1 | 9/2004 | Khater et al. | |
| 2005/0212087 A1 | 9/2005 | Akatsu et al. | |
| 2005/0236647 A1 | 10/2005 | Khater | |
| 2006/0113634 A1 | 6/2006 | Ahmed et al. | |
| 2006/0177986 A1 | 8/2006 | Joseph et al. | |
| 2006/0231924 A1 | 10/2006 | Adam et al. | |
| 2007/0126080 A1 | 6/2007 | Wallner et al. | |
| 2007/0166900 A1 | 7/2007 | Li et al. | |
| 2008/0179632 A1 | 7/2008 | Adam et al. | |
| 2009/0101942 A1 | 4/2009 | Dyer | |
| 2009/0179228 A1 | 7/2009 | Joseph et al. | |
| 2012/0098039 A1 | 4/2012 | Miu et al. | |
| 2012/0112244 A1 | 5/2012 | Camillo-Castillo et al. | |
| 2013/0009280 A1 | 1/2013 | Camillo-Castillo et al. | |

OTHER PUBLICATIONS

USPTO, Office Action issued in related U.S. Appl. No. 13/177,146 dated Jan. 7, 2013.

"A low-cost fully self-aligned SiGe BiCMOS technology using selective epitaxy and a lateral quasi-single-poly integration concept" Tilke, et al., Electron Devices, IEEE Transactions on, vol. 51, Issue: 7, Publication Year: 2004, pp. 1101-1107.

"Self-aligned bipolar epitaxial base n-p-n transistors by selective epitaxy emitter window (SEEW) technology", Burghartz, J.N. et al., Electron Devices, IEEE Transactions on, vol. 38, Issue: 2, Publication Year: 1991, pp. 378-385.

Harame, et al., "The revolution in SiGe: impact on device electronics", Applied Surface Science 224 (2004) 9-17.

Hall, et al., "Silicon-germanium for ULSI", Journal of Telecommunications and Information Technology, pp. 3-4, 2000.

Dunn, et al., U.S. Appl. No. 13/757,961 entitled Trench Isolation for Bipolar Junction Transistors in BICMOS Technology, filed Feb. 4, 2013.

Adkisson, et al., U.S. Appl. No. 13/705,717 entitled Bipolar Junction Transistors With Reduced Base-Collector Junction Capacitance, filed Dec. 5, 2012.

Liu, et al., "A dual-polarity SCR for RF IC ESD protection", 2008 International Conference on Communications, Circuits and Systems, Fujian, China, May 25-27, 2008, pp. 1228-1230.

Liu, et al., "An Improved Bidirectional SCR Structure for Low-Triggering ESD Protection Applications", IEEE Electron Device Letters, vol. 29, No. 4, Apr. 2008, pp. 360-362.

Wang, et al., "Cross-Coupling Low-Triggering Dual-Polarity CLTdSCR ESD Protection in CMOS", IEEE Electron Device Letters, vol. 31, No. 10, Oct. 2010, pp. 1143-1145.

European Patent Office, International Search Report and Written Opinion issued in PCT/US2013/057970 dated Nov. 12, 2013.

* cited by examiner

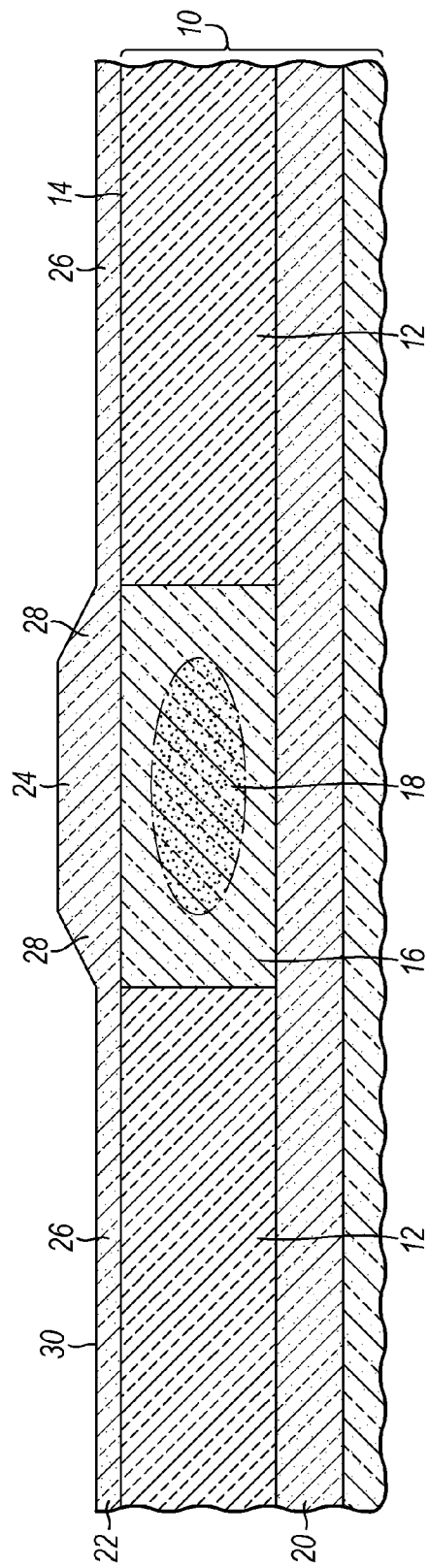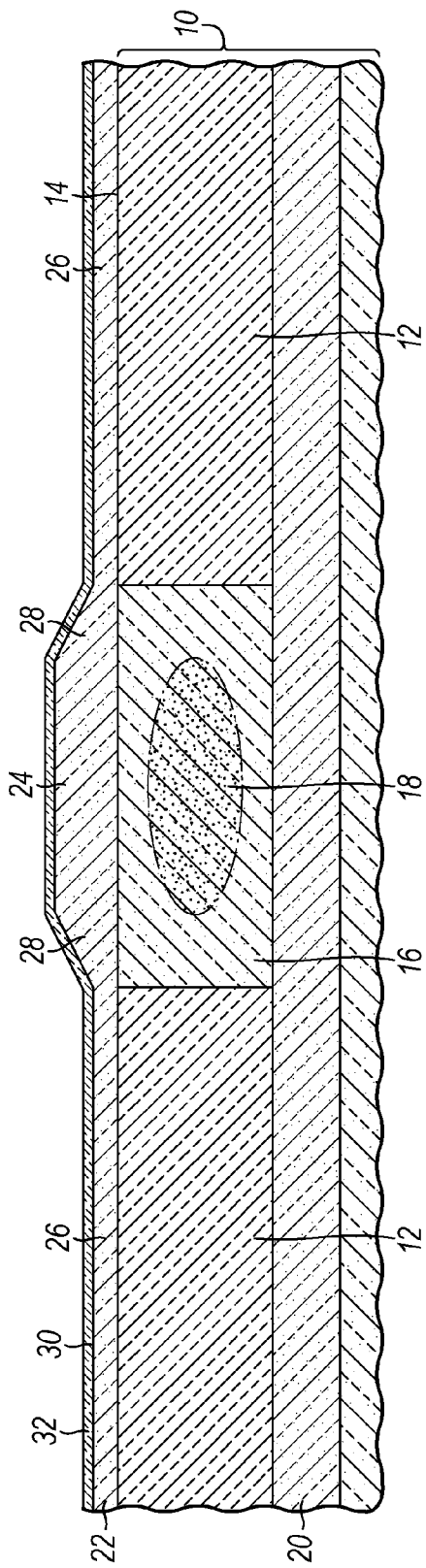
FIG. 1
FIG. 2

US 8,716,837 B2

BIPOLAR JUNCTION TRANSISTORS WITH A LINK REGION CONNECTING THE INTRINSIC AND EXTRINSIC BASES

CROSS-REFERENCE TO RELATED APPLICATIONS

This application is a divisional of application Ser. No. 13/177,146, filed Jul. 6, 2011, now U.S. Pat. No. 8,536,012 issued Sep. 17, 2013, which is hereby incorporated by reference herein in its entirety.

BACKGROUND

The invention relates generally to semiconductor device fabrication and, in particular, to bipolar junction transistors, fabrication methods for a bipolar junction transistor, and design structures for a bipolar junction transistor.

Bipolar junction transistors are typically found in demanding types of integrated circuits, especially integrated circuits for high-frequency applications. One application for bipolar junction transistors is in radiofrequency integrated circuits (RFICs), which are used in wireless communications systems, power amplifiers in cellular telephones, and other types of high speed integrated circuits. Bipolar junction transistors may also be combined with complementary metal-oxide-semiconductor (CMOS) field effect transistors in bipolar complementary metal-oxide-semiconductor (BiCMOS) integrated circuits, which take advantage of the positive characteristics of both transistor types in the construction of the integrated circuit.

Conventional bipolar junction transistors are three-terminal electronic devices that include three semiconductor regions, namely the emitter, base, and collector regions. Generally, a bipolar junction transistor includes a pair of p-n junctions, namely a collector-base junction and an emitter-base junction. A heterojunction bipolar junction transistor is a device type that employs at least two semiconductor materials characterized by different band gaps for the emitter and base regions, thereby creating a heterojunction. For example, the emitter of the heterojunction bipolar junction transistor may be comprised of silicon and the base of a heterojunction bipolar junction transistor may be comprised of silicon germanium, which possesses a narrower band gap than silicon.

Improved device structures, fabrication methods, and design structures are needed for bipolar junction transistors.

BRIEF SUMMARY

In an embodiment of the invention, a method is provided for fabricating a bipolar junction transistor. The method includes forming a dielectric layer on an intrinsic base layer and forming an extrinsic base layer on the dielectric layer. The extrinsic and intrinsic base layers are separated from each other by the dielectric layer. The method further includes forming an emitter opening extending through the extrinsic base layer and the dielectric layer. The dielectric layer is recessed laterally relative to the emitter opening to define a cavity between the intrinsic base layer and the extrinsic base layer and that opens into the emitter opening. The cavity is filled with a semiconductor layer that physically couples or links the extrinsic and intrinsic base layers.

In an embodiment of the invention, a device structure is provided for a bipolar junction transistor. The device structure includes an intrinsic base, an extrinsic base, and a dielectric layer between the intrinsic base and the extrinsic base. An emitter opening extends through extrinsic base and the dielectric layer to the intrinsic base. An emitter is disposed in the emitter opening. The device structure further includes a semiconductor layer between the emitter and the intrinsic base. The semiconductor layer extends laterally relative to the emitter opening to establish a physical link between the extrinsic base and the intrinsic base.

In an embodiment of the invention, a hardware description language (HDL) design structure is encoded on a machine-readable data storage medium. The HDL design structure comprises elements that, when processed in a computer-aided design system, generates a machine-executable representation of a bipolar junction transistor. The HDL design structure includes an intrinsic base, an extrinsic base, and a dielectric layer between the intrinsic base and the extrinsic base. An emitter opening extends through extrinsic base and the dielectric layer to the intrinsic base. An emitter is disposed in the emitter opening. The design structure further includes a semiconductor layer between the emitter and the intrinsic base. The semiconductor layer extends laterally relative to the emitter opening to establish a physical link between the extrinsic base and the intrinsic base. The HDL design structure may comprise a netlist. The HDL design structure may also reside on storage medium as a data format used for the exchange of layout data of integrated circuits. The HDL design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIGS. 1-9 are cross-sectional views of a portion of a substrate at successive fabrication stages of a processing method for fabricating a device structure in accordance with an embodiment of the invention.

DETAILED DESCRIPTION

With reference to FIG. 1 and in accordance with an embodiment of the invention, a substrate 10 is comprised of a semiconductor material. Substrate 10 may be any suitable bulk substrate comprising a semiconductor material that a person having ordinary skill in the art would recognize as suitable for forming an integrated circuit. For example, substrate 10 may be comprised of a wafer of a monocrystalline silicon-containing material, such as single crystal silicon with a (100) crystal lattice orientation. The monocrystalline semiconductor material contained in the substrate 10 may contain a definite defect concentration and still be considered single crystal. The semiconductor material comprising substrate 10 may be lightly doped with an impurity to alter its electrical properties and may include an epitaxial layer. For example, the substrate 10 may be lightly doped with a p-type impurity species, such as boron, to render it initially p-type.

Figure 9:
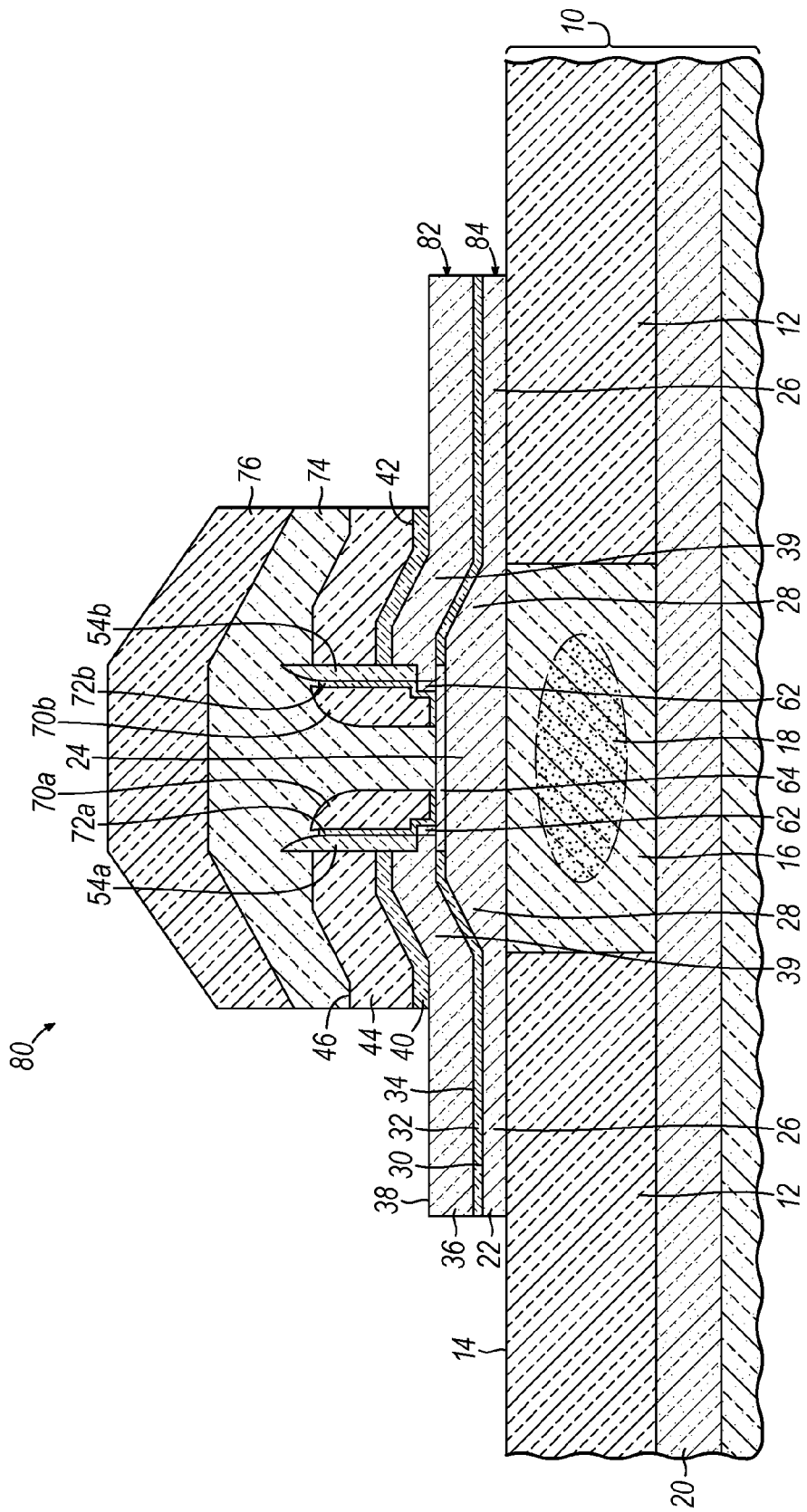

Trench isolation regions 12 are formed by a conventional process in the substrate 10 as isolation structures. In one embodiment, the trench isolation regions 12 may be isolation structures formed by a shallow trench isolation (STI) technique that relies on a lithography and dry etching process that defines closed-bottomed trenches in substrate 10, fills the trenches with dielectric, and planarizes the layer to a top surface 14 of the substrate 10 using a chemical mechanical polishing (CMP) process. The dielectric may be an oxide of silicon, such as densified tetraethylorthosilicate (TEOS) deposited by chemical vapor deposition (CVD) or a high-density plasma (HDP) oxide deposited with plasma assistance. The trench isolation regions 12 circumscribe and electrically isolate a device region 16 of the substrate 10 that is used in the fabrication of the bipolar junction transistor 80 (FIG. 9).

A collector region 18 and a subcollector region 20 of a bipolar junction transistor 80 (FIG. 9) are present as impurity-doped regions in the substrate 10. The collector region 18 and subcollector region 20 are doped with different concentrations of an electrically-active dopant, such as an impurities species from Group V of the Periodic Table (e.g., arsenic) effective to impart an n-type conductivity in which electrons are the majority carriers and dominate the electrical conductivity of the semiconductor material. The collector region 18 and the subcollector region 20 may be formed by ion implantation of an n-type dopant and annealing to activate the dopant using techniques and conditions familiar to one skilled in the art. For example, the collector region 18 may comprise a selectively implanted collector (SIC) formed by implanting an n-type dopant with selected dose and kinetic energy into the central part of the device region 16, and may be formed at any appropriate point in the process flow. During the course of the processing method, the dopant in the collector region 18 will diffuse laterally and vertically such that substantially the entire central portion of device region 16 becomes doped and is continuous structurally with the subcollector region 20.

An intrinsic base layer 22, which is comprised of a material suitable for forming an intrinsic base 84 of the bipolar junction transistor 80 (FIG. 9), is deposited as a continuous additive layer on the top surface 14 of substrate 10 and, in particular on the top surface 14 of the device region 16 of substrate 10. In the representative embodiment, the intrinsic base layer 22 directly contacts the top surface 14 of the device region 16 and a top surface of the trench isolation regions 12. Intrinsic base layer 22 may be comprised of a semiconductor material $Si_xGe_{1-x}$ including silicon (Si) and germanium (Ge) with the germanium content (1−x) ranging from 5 atomic percent to 50 atomic percent and the silicon content (x) ranging from 95 atomic percent to 50 atomic percent. The germanium content of the intrinsic base layer 22 may be uniform or the germanium content of intrinsic base layer 22 may be graded or stepped across the thickness of intrinsic base layer 22. The intrinsic base layer 22 may be doped with one or more impurity species, such as boron and/or carbon.

Intrinsic base layer 22 is formed using a low temperature epitaxial (LTE) growth process (typically at a growth temperature ranging from 400° C. to 850° C.). The epitaxial growth process is performed after the trench isolation regions 12 have already been formed. The epitaxial growth process is non-selective as single crystal semiconductor material (e.g., single crystal silicon or SiGe) is deposited epitaxially onto any exposed crystalline surface such as the exposed top surface 14 of device region 16, and non-monocrystalline semiconductor material (e.g., polysilicon or polycrystalline SiGe) is deposited non-epitaxially onto the non-crystalline material of the trench isolation regions 12 or regions (not shown) where polycrystalline semiconductor material already exists.

Because of the non-selectivity of the epitaxial growth process, the intrinsic base layer 22 includes a raised region 24, a non-raised region 26 surrounding the raised region 24, and a facet region 28 between the raised region 24 and the non-raised region 26. The raised region 24 of the intrinsic base layer 22 is comprised of monocrystalline semiconductor material and is laterally positioned in vertical alignment with the collector region 18 and device region 16 of the substrate 10. The non-raised region 26 of the intrinsic base layer 22 is comprised of polycrystalline semiconductor material and overlies the trench isolation regions 12 near the raised region 24. The facet region 28 of the intrinsic base layer 22 may be comprised of either a mixture of polycrystalline and monocrystalline material in or primarily single crystal material in facet region 28. The thickness of the intrinsic base layer 22 may range from about 10 nm to about 600 nm with the largest layer thickness in the raised region 24 and the layer thickness of the non-raised region 26 less than the layer thickness of the raised region 24. The layer thicknesses herein are evaluated in a direction normal to the top surface 14 of substrate 10. The facet region 28 has a thickness that monotonically varies in a direction from the abutment with the raised region 24 to the abutment with the non-raised region 26. As the thickness of intrinsic base layer 22 increases, the width of the raised region 24 likewise increases so that the facet region 28 moves laterally outward relative to the centerline of the raised region 24.

With reference to FIG. 2 in which like reference numerals refer to like features in FIG. 1 and at a subsequent fabrication stage, a base dielectric layer 32 is formed on a top surface 30 of intrinsic base layer 22 and, in the representative embodiment, directly contacts the top surface 30. The base dielectric layer 32 may be an insulating material with a dielectric constant (e.g., a permittivity) characteristic of a dielectric. In one embodiment, the base dielectric layer 32 may be a high temperature oxide (HTO) deposited using rapid thermal process (RTP) at temperatures of 500° C. or higher, and may be comprised of an oxide of silicon, such as silicon dioxide ($SiO_2$) having a nominal dielectric constant of 3.9. Alternatively, if the base dielectric layer is comprised of oxide, the material of base dielectric layer 32 may be deposited by a different deposition process, or thermal oxidation of silicon such as oxidation at high pressure with steam (HIPOX), or a combination of above oxide formation techniques known to those of ordinary skill in the art. The base dielectric layer 32 possesses the topology of the underlying intrinsic base layer 22.

Figure 3:
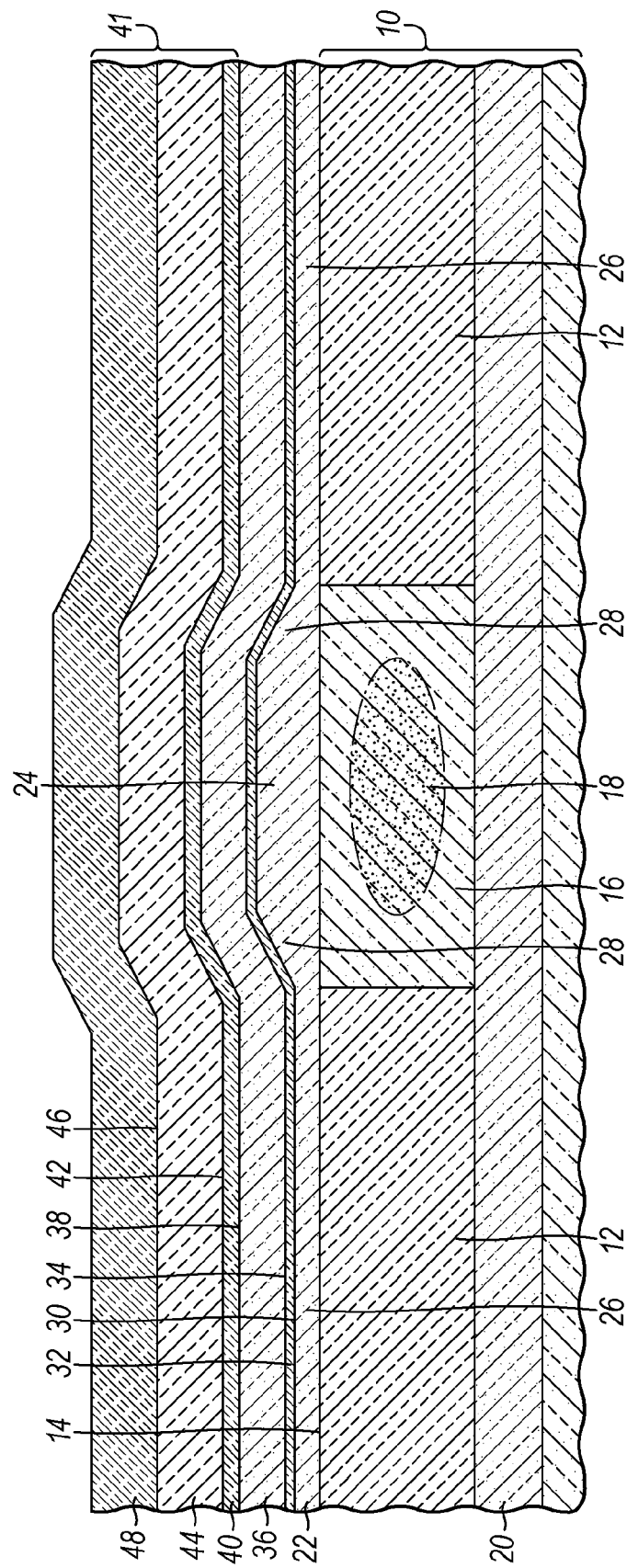

With reference to FIG. 3 in which like reference numerals refer to like features in FIG. 2 and at a subsequent fabrication stage, an extrinsic base layer 36 is formed on a top surface 34 of base dielectric layer 32 and, in the representative embodiment, directly contacts the top surface 34. The extrinsic base layer may be comprised of a material with a different etching selectivity than the underlying base dielectric layer 32. In one embodiment, the extrinsic base layer 36 may be comprised of polycrystalline semiconductor material (e.g., polysilicon or polycrystalline SiGe) deposited by CVD process. The extrinsic base layer 36 may be doped in situ during deposition with a concentration of a dopant, such as an impurity species from Group III of the Periodic Table (e.g., boron) effective to impart a p-type conductivity. As a result of the deposition process and the non-crystalline nature of base dielectric layer 32 on which extrinsic base layer 36 is formed, the entire extrinsic base layer 36 is comprised of polycrystalline semiconductor material. The uneven topology of the underlying intrinsic base layer 22 is reproduced in the extrinsic base layer 36 so that the extrinsic base layer 36 has a raised region 35 (FIG. 4) that overlies the raised region 24 of the intrinsic base layer 22.

An emitter dielectric stack 41 comprised of dielectric layers 40, 44, 48 is then formed on the extrinsic base layer 36 and also reproduces the topology of the underlying intrinsic base layer 22. Dielectric layer 40 is formed on a top surface 38 of extrinsic base layer 36 and, in the representative embodiment, directly contacts the top surface 38. Dielectric layer 40 may be comprised of a dielectric material with a different etching selectivity than the underlying dielectric layer 40. In one embodiment, dielectric layer 40 may be comprised of $SiO_2$ deposited by CVD or another suitable deposition process. Layer 44 is formed on a top surface 42 of dielectric layer 40 and, in the representative embodiment, directly contacts the top surface 42. Layer 44 may be comprised of a dielectric material with a different etching selectivity than the underlying dielectric layer 40. In one embodiment, layer 44 may be comprised of silicon nitride ($Si_3N_4$) deposited using CVD or another suitable deposition process. Dielectric layer 48, which may be comprised of a dielectric material with a different composition than dielectric layer 44 and the same composition as layer 40, is deposited on a top surface 46 of dielectric layer 44 and, in the representative embodiment, directly contacts the top surface 46. Dielectric layer 48 may be comprised of a dielectric material with a different etching selectivity than the underlying layer 44. In one embodiment, dielectric layer 48 may be comprised of $SiO_2$ deposited by CVD or another suitable deposition process.

Figure 4:
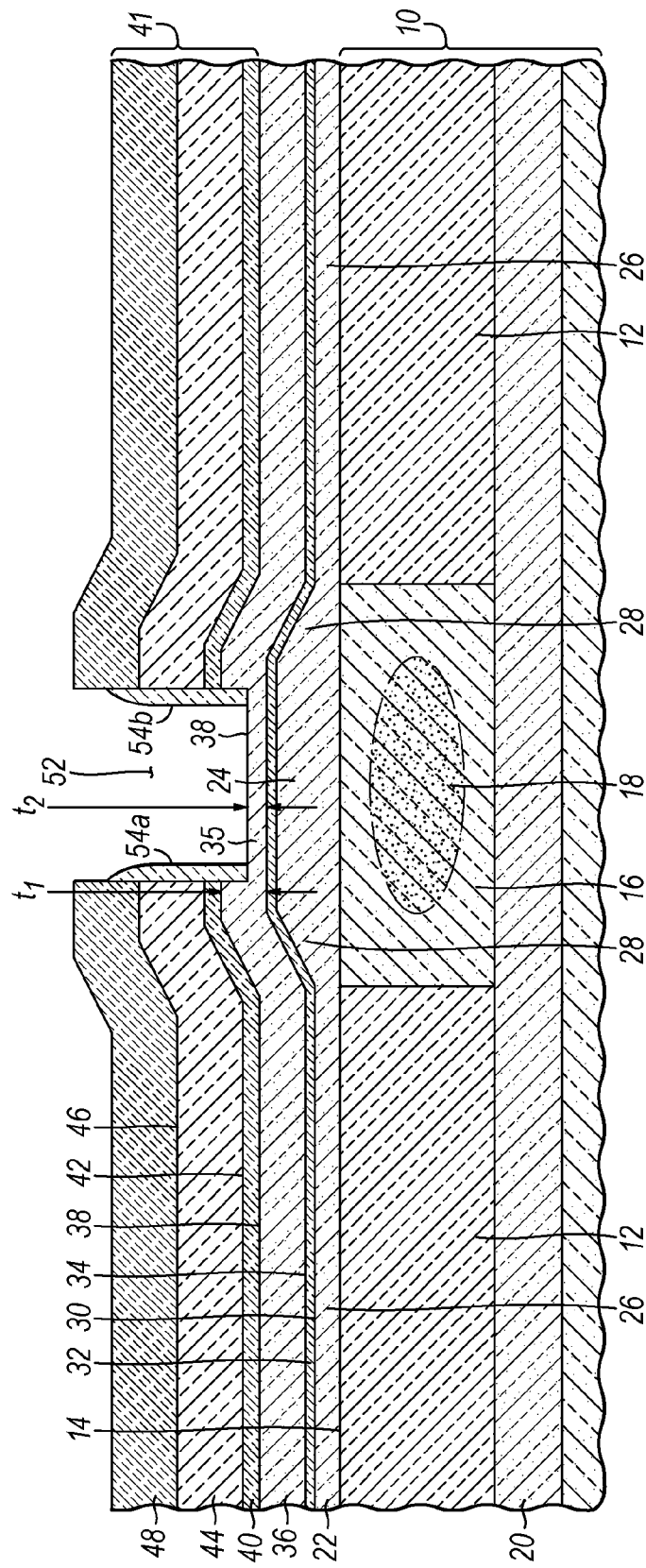

With reference to FIG. 4 in which like reference numerals refer to like features in FIG. 3 and at a subsequent fabrication stage, dielectric layers 40, 44, 48 of the emitter dielectric stack 41 are patterned using photolithography and subtractive etching processes to define an emitter opening 52 aligned with the raised region 24 of the intrinsic base layer 22. To that end, the emitter dielectric stack 41 is masked with a patterned etch mask (not shown). In one embodiment, the etch layer may be a photoresist layer comprised of a sacrificial organic material applied by spin coating to the top surface of dielectric layer 48. The photolithography process entails exposing the photoresist layer to radiation imaged through a photomask and developing the resultant latent feature pattern in the exposed photoresist to define a window at the intended location for the emitter opening 52.

A subtractive etching process, such as a reactive-ion etching (RIE) process, is used to sequentially remove a region of each of the dielectric layer 40, 44, 48 over a surface area exposed through the window and unprotected by the etch mask. For example, an initial segment of the etching process has an etch chemistry that removes the unprotected region of dielectric layer 48 and stops on the top surface 46 of layer 44. The etch chemistry may be changed to remove the unprotected region of the underlying layer 44 and stop on the top surface 42 of dielectric layer 40. The etch chemistry may be changed again to remove the unprotected region of the underlying dielectric layer 40 and stop on the top surface 38 of extrinsic base layer 36. Alternatively, a simpler etch chemistry might be used that includes fewer etch steps.

A subtractive etching process, such as a RIE process, is used to partially remove the thickness of the raised region 35 of the extrinsic base layer 36 across the surface area of the top surface 38 that is exposed inside the emitter opening 52. The subtractive etching process is controlled such that the emitter opening 52 is only partially extended through the thickness of the extrinsic base layer 36. After etching, the top surface 38 of extrinsic base layer 36 in the raised region 35 is recessed relative to the top surface 38 of the extrinsic base layer 36 in regions protected by the emitter dielectric stack 41 and etch mask. The raised region 35 of the extrinsic base layer 36 has a thickness $t_2$, measured normal to the top surface 38, over its surface area inside the emitter opening 52. The thickness $t_2$, is less than the thickness $t_1$ of the extrinsic base layer 36 (and the raised region 35) outside of the emitter opening 52, which gives rise to a thickness difference. In one embodiment, the subtractive etching process is controlled such that the emitter opening 52 extends approximately half-way through the layer thickness of the base dielectric layer 32 and, as a result, the thickness $t_1$ is about twice the thickness $t_2$. Following the conclusion of the subtractive etching process, the etch mask is removed and, if comprised of photoresist, the etch mask may be removed by oxygen plasma ashing or chemical stripping.

Spacers 54a, 54b are formed on the vertical sidewalls of the layers 36, 40, 44, 48 bounding the emitter opening 52. The spacers 54a, 54b extend vertically to the base of the emitter opening 52 to directly contact the recessed top surface 38 of extrinsic base layer 36. In a representative embodiment, the spacers 54a, 54b may be formed by depositing a blanket layer (not shown) comprised of a non-conductive, dielectric material and shaping the blanket layer with an anisotropic etching process, such as a RIE process, that preferentially removes the constituent dielectric material from horizontal surfaces. At the conclusion of the anisotropic etching process, the spacers 54a, 54b are constituted by residual dielectric material residing on the vertical surfaces in the form of the sidewalls of the layers 36, 40, 44, 48. The dielectric material comprising spacers 54a, 54b may be, for example, $Si_3N_4$ deposited by CVD in which instance the spacers 54a, 54b are composed of the same dielectric material as dielectric layer 44.

Figure 5:
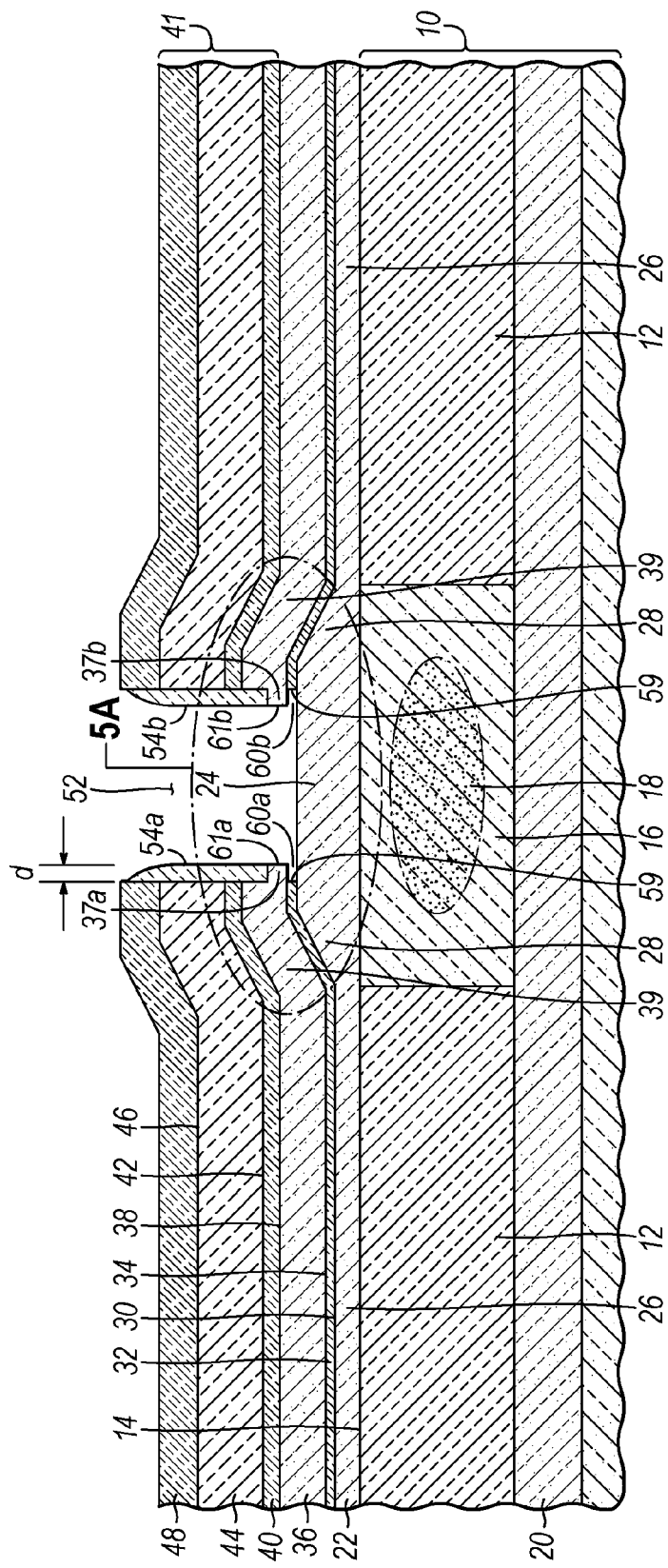
Figure 5A:
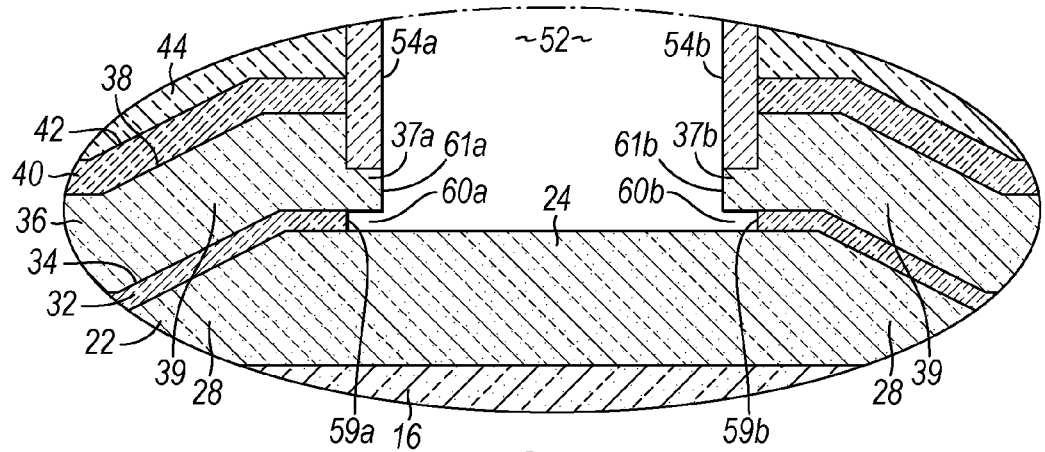
FIG. 5A is an enlarged view of a portion of FIG. 5.

With reference to FIGS. 5, 5A in which like reference numerals refer to like features in FIG. 4 and at a subsequent fabrication stage, an anisotropic etching process, such as a RIE process, is then used to continue the removal of the raised region 35 of extrinsic base layer 36 across the surface area of top surface 38 that is exposed inside the emitter opening 52. The etching process removes the material of extrinsic base layer 36 selectively (e.g., at a higher etch rate) to the materials comprising the spacers 54a, 54b and the base dielectric layer 32. The etching process stops on the base dielectric layer 32 and exposes the top surface 34 of the base dielectric layer 32 inside the emitter opening 52. The extrinsic base layer 36 is completely removed across the surface area of the raised region 35 inside the emitter opening 52. Adjacent to the emitter opening 52 and beneath the spacers 54a, 54b, sections 37a, 37b of extrinsic base layer 36 retain the thickness $t_2$ (FIG. 4). Sidewall 61a of section 37a is vertically aligned with the adjacent portion of the sidewall of the spacer 54a bounding the emitter opening 52. Sidewall 61b of section 37b is vertically aligned with the adjacent portion of the sidewall of the spacer 54b bounding the emitter opening 52. The extrinsic base layer 36 retains the original thickness $t_1$ (FIG. 4) over sections 39 separated from the emitter opening by sections 37a, 37b.

An isotropic etching process, such as a wet chemical etching process, is used to remove a region of base dielectric layer 32 inside the emitter opening 52 and stops on the top surface 30 of the intrinsic base layer 22. The removal of this region of base dielectric layer 32 exposes the top surface 30 of intrinsic base layer 22 over a portion of the raised region 24. The isotropic etching process removes the material of base dielectric layer 32 selectively to the materials comprising the spacers 54a, 54b, the extrinsic base layer 36, and the intrinsic base layer 22. The etchant reaches the base dielectric layer 32 through the emitter opening 52. In one embodiment, the wet chemical etching process may use either a dilute hydrofluoric (DHF) or a buffered hydrofluoric (BHF) as an etchant, such as a wet hydrofluoric acid (HF) oxide dip. If dielectric layer 48 is comprised of oxide and depending on the etching conditions, the isotropic etching process base may partially remove dielectric layer 48 from dielectric layer 44, as shown in the representative embodiment, or may completely remove dielectric layer 48 from dielectric layer 44.

Cavities 60a, 60b are formed between the sections 37a, 37b of extrinsic base layer 36 and the intrinsic base layer 22 by the isotropic etching process performed on the base dielectric layer 32. Specifically, the isotropic etching process causes the base dielectric layer 32 to recede laterally beneath the sections 37a, 37b of extrinsic base layer 36 and, more specifically, sidewalls 59a, 59b of the base dielectric layer 32 are respectively caused to laterally recede relative to the respective sidewall 61a, 61b of the sections 37a, 37b. In the representative embodiment, the sidewalls 59a, 59b of the base dielectric layer 32 are each respectively recessed by a distance, d, relative to the sidewalls 61a, 61b of sections 37a, 37b. In the representative embodiment, the cavities 60a, 60b formed by the lateral recession of base dielectric layer 32 extend only partially across the raised region 24 of the intrinsic base layer 22. The cavities 60a, 60b provide open volumes between the intrinsic base layer 22 and the extrinsic base layer 36.

Figure 5B:
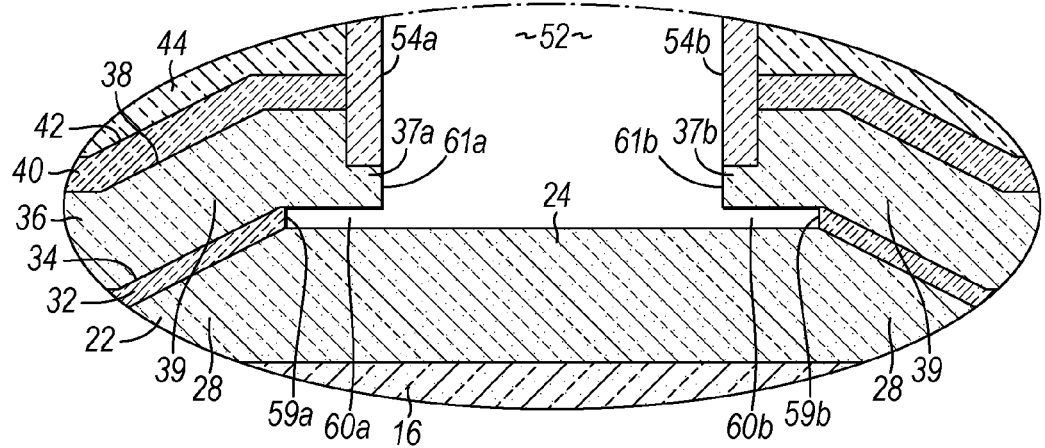
FIG. 5B is an enlarged view similar to FIG. 5A in accordance with an alternative embodiment of the invention.
Figure 5C:
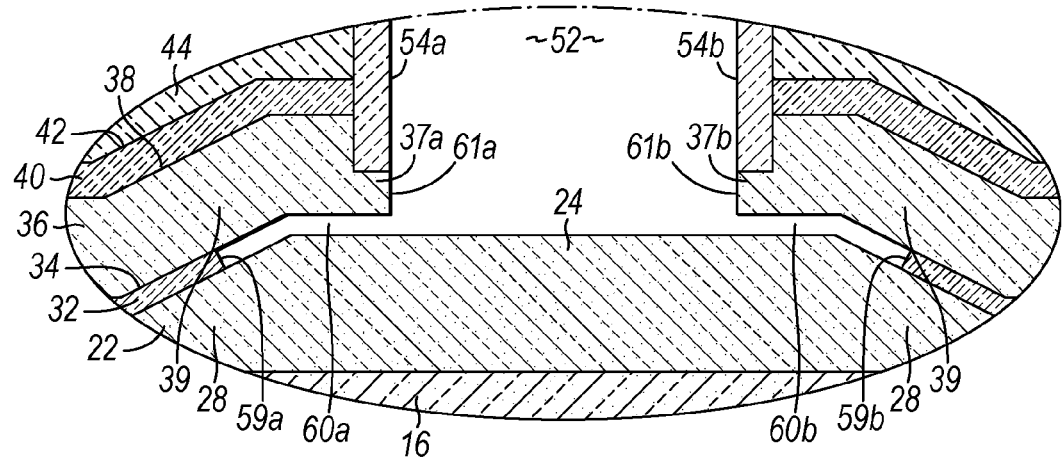
FIG. 5C is an enlarged view similar to FIGS. 5A and 5B in accordance with another alternative embodiment of the invention.

The etch bias may be controlled during etching to regulate the lateral recession of the base dielectric layer 32 and, hence, the location of the sidewalls 59a, 59b of the base dielectric layer 32. In an alternative embodiment, the cavities 60a, 60b formed by the lateral recession of base dielectric layer 32 may extend from the emitter opening 52 across the raised region 24 to approximately the boundary with the facet region 28 of the intrinsic base layer 22, as shown in FIG. 5B. In another alternative embodiment, the cavities 60a, 60b formed by the lateral recession of base dielectric layer 32 may extend from the emitter opening 52 past the boundary between the raised region 24 and the facet region 28 and therefore partially across the facet region 28, as shown in FIG. 5C. However, the etching process is controlled so that the cavities 60a, 60b formed by the lateral recession of base dielectric layer 32 do not extend as far as the non-raised region 26 of the intrinsic base layer 22.

Because the top surface 38 of extrinsic base layer 36 is recessed before the spacers 54a, 54b are formed, the thickness of the sections 37a, 37b is less than the thickness of the remainder of extrinsic base layer 36 outside of the vicinity of the emitter opening 52. In a representative embodiment, the sections 37a, 37b may be one half of the thickness of the remainder of extrinsic base layer 36, which is nominally equal to the original deposited thickness. The sections 37a, 37b may extend about the perimeter of the emitter opening 52 and may be connected together.

Figure 5D:
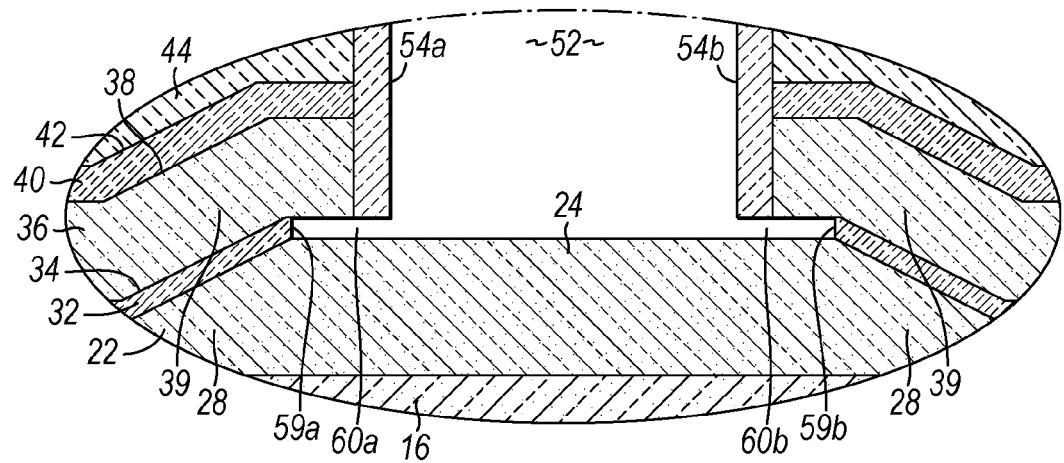
FIG. 5D is an enlarged view similar to FIGS. 5A-5C in accordance with another alternative embodiment of the invention.

With reference to FIG. 5D and in accordance with an alternative embodiment, the sections 37a, 37b may be absent from the device structure and the spacers 54a, 54b may extend vertically to occupy this space. The subtractive etching process of FIG. 4 is altered so that the entire thickness of the raised region 35 of the extrinsic base layer 36 is removed across the surface area of the top surface 38 that is exposed inside the emitter opening 52 (i.e., thickness $t_2=0$). After etching, the top surface 34 of the dielectric layer 32 is exposed. The spacers 54a, 54b, which are formed in FIG. 4 on the vertical sidewalls of the layers 36, 40, 44, 48 bounding the emitter opening 52, will extend vertically to directly contact the top surface 34 of the dielectric layer 32. The isotropic etching process, which is used to remove the region of base dielectric layer 32 exposed inside the emitter opening 52, forms the cavities 60a, 60b by recessing the base dielectric layer 32 laterally beneath the spacers 54a, 54b. The recession of base dielectric layer 32 is such that the cavities 60a, 60b partially extend between the intrinsic and extrinsic base layers 22, 36.

Figure 6:
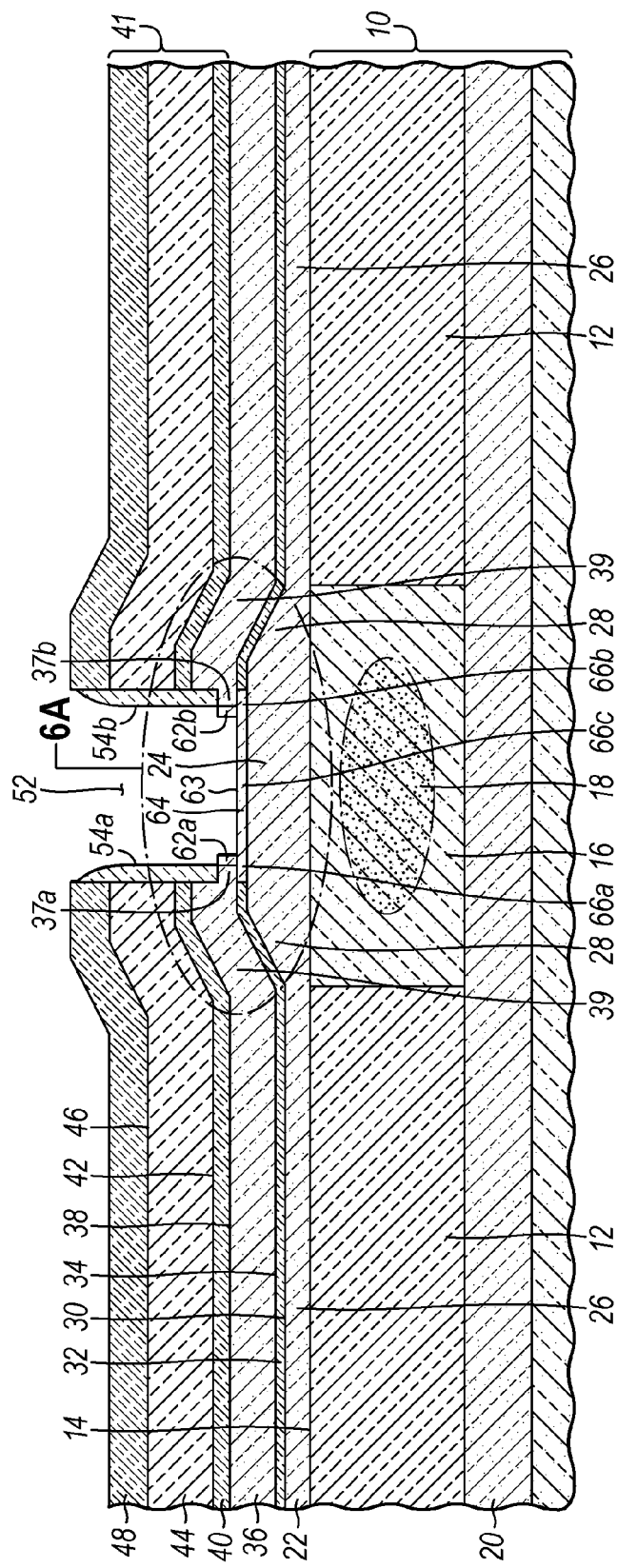
Figure 6A:
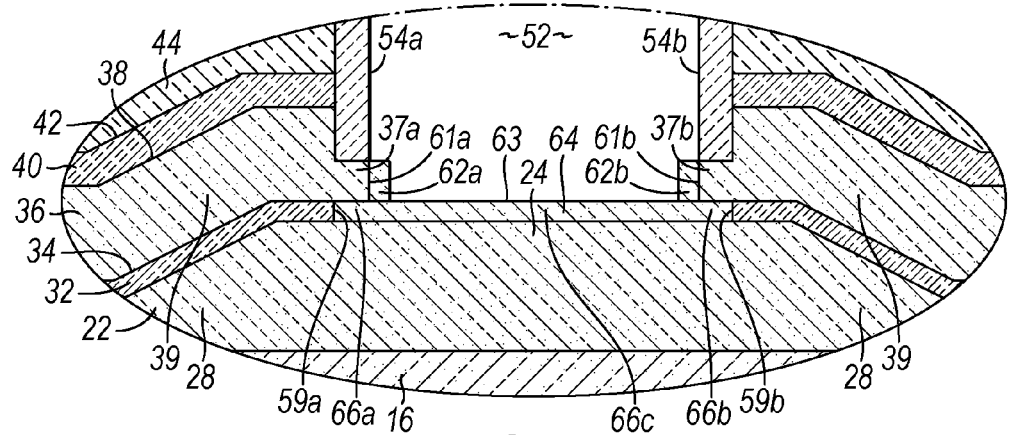
FIG. 6A is an enlarged view of a portion of FIG. 6 and shows the embodiment of FIG. 5A at a subsequent fabrication stage.

With reference to FIGS. 6, 6A in which like reference numerals refer to like features in FIGS. 5, 5A and at a subsequent fabrication stage, a semiconductor layer 64 is formed as an additive layer on the top surface 30 of the intrinsic base layer 22 and, in the representative embodiment, is directly formed on the top surface 30. The semiconductor layer 64 is comprised of semiconductor material deposited by a non-selective deposition process, such as Ultra High Vacuum Chemical Vapor Deposition (UHV-CVD), or by a different process such as a selective deposition process. The semiconductor material comprising the semiconductor layer 64 may be doped during or following deposition, or may be alternatively undoped. The semiconductor layer 64 may have a different composition than either the intrinsic base layer 22 or the extrinsic base layer 36.

During the deposition process, the semiconductor material of semiconductor layer 64 nucleates on the semiconductor material of the intrinsic base layer 22 and acquires the crystalline state of the intrinsic base layer 22. For example, the raised region 24 of intrinsic base layer 22, which is comprised of single crystal semiconductor material, may serve as a crystalline template for the growth of semiconductor layer 64. The deposition conditions are tailored to provide a nucleation delay so that nucleation, if any, on the spacers 54a, 54b and dielectric layer 48 (or dielectric layer 44 if dielectric layer 48 has been previously removed) lags the nucleation of the semiconductor material on exposed surfaces such as the intrinsic base layer 22 and the bottom surfaces of the sections 37a, 37b of layer 36. In other words, the nucleation delay represents a time delay that permits the cavities 60a, 60b to be filled by semiconductor layer 64 before any significant amount of semiconductor material begin to form on the spacers 54a, 54b and/or on the dielectric layer 48. The thickness of the semiconductor layer 64 measured in a direction normal to the top surface 30 may be at least 4 nm.

Peripheral sections 66a, 66b of the semiconductor layer 64, which are disposed along the outer perimeter or edges of semiconductor layer 64, respectively occupy the cavities 60a, 60b (FIG. 5) and define a link physically coupling the intrinsic base layer 22 and the extrinsic base layer 36. The peripheral sections 66a, 66b of the semiconductor layer 64 and the extrinsic base layer 36 are in direct contact with each other, as are the peripheral sections 66a, 66b and the top surface 30 of the intrinsic base layer 22. The peripheral sections 66a, 66b extend laterally from the emitter opening 52 to, respectively, the sidewalls 59a, 59b of the base dielectric layer 32. The link provides a direct connection for current flow between the extrinsic base layer 36 and the intrinsic base layer 22. The peripheral sections 66a, 66b of the semiconductor layer 64 and the base dielectric layer 32 may have approximately equal layer thicknesses and, preferably, have equivalent layer thicknesses because the cavities 60a, 60b are formed by the lateral recession of base dielectric layer 32 and then respectively filled by the peripheral sections 66a, 66b of the semiconductor layer 64. A central section 66c of the semiconductor layer 64, which is positioned between the peripheral sections 66a, 66b and is continuous with the peripheral sections 66a, 66b, is not located inside the cavities 60a, 60b.

If the emitter opening 52 has a closed geometric shape (e.g., rectangular), then the sidewall 59a of the base dielectric layer 32 may be joined with the sidewall 59b of the base dielectric layer 32 by additional sidewalls (not shown) of the base dielectric layer 32, and the cavity 60a is joined with the cavity 60b by additional cavities (not shown) recessing the base dielectric layer 32. However, if the emitter opening 52 lacks a closed geometric shape, then the sidewall 59a of the base dielectric layer 32 is not joined with the sidewall 59b of the base dielectric layer 32, and the cavity 60a is not joined with the cavity 60b.

The semiconductor material also nucleates on the material of the sections 37a, 37b of extrinsic base layer 36 and grows laterally inward as regions 62a, 62b of polycrystalline material into the emitter opening 52. In the representative embodiment, the additive regions 62a, 62b project a short distance into the emitter opening 52 so that the emitter opening 52 is not significantly pinched off.

Figure 6B:
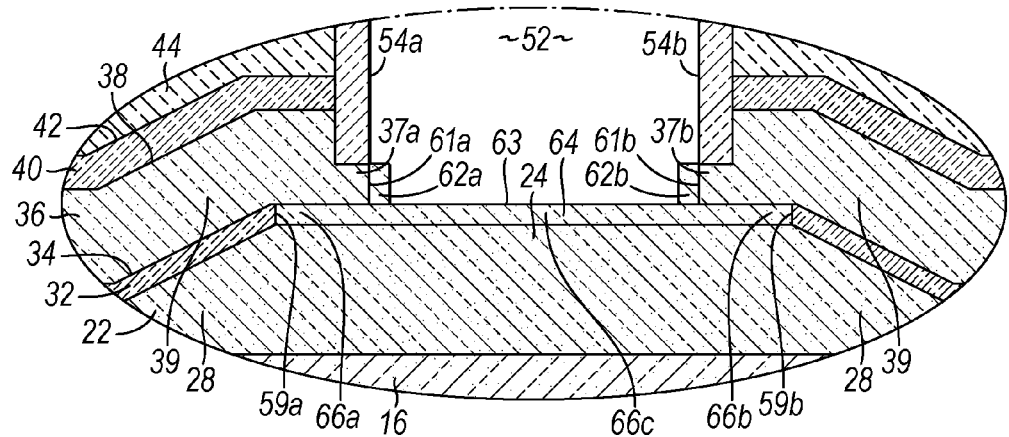
FIG. 6B is an enlarged view similar to FIG. 6A and shows the embodiment of FIG. 5B at a subsequent fabrication stage.
Figure 6C:
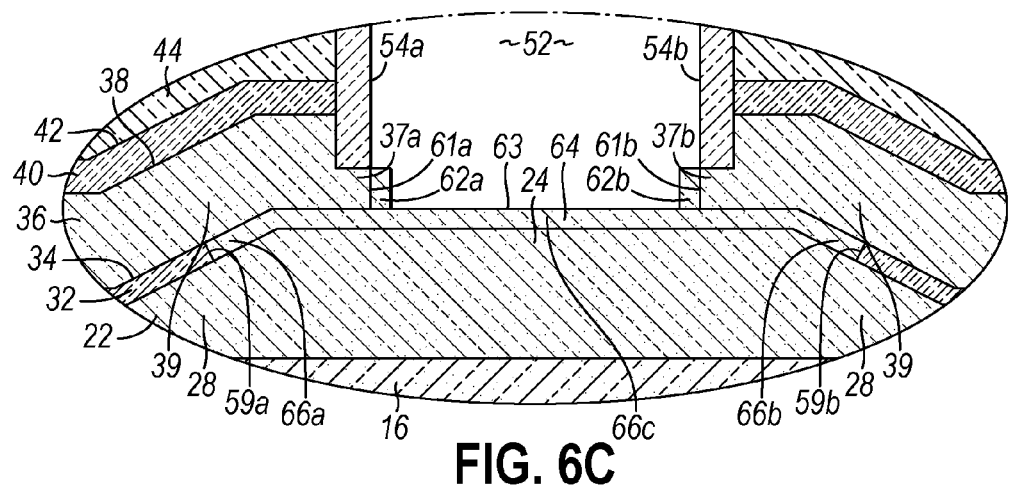
FIG. 6C is an enlarged view similar to FIGS. 6A and 6B and shows the embodiment of FIG. 5C at a subsequent fabrication stage.
Figure 6D:
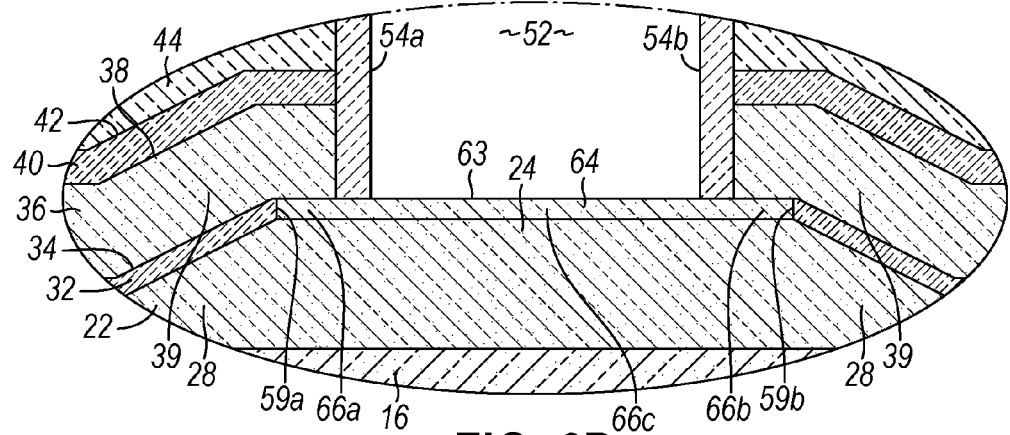
FIG. 6D is an enlarged view similar to FIGS. 6A-6C and shows the embodiment of FIG. 5D at a subsequent fabrication stage.

In the alternative embodiment in which the cavities 60a, 60b to approximately the boundary between the raised region 24 and the facet region 28 (FIG. 5B) of the intrinsic base layer 22, the peripheral sections 66a, 66b of the semiconductor layer 64 will likewise extend laterally approximately to this boundary as shown in FIG. 6B. In the alternative embodiment in which the cavities 60a, 60b extend past the boundary between the raised region 24 and the facet region 28 (FIG. 5C), the peripheral sections 66a, 66b of the semiconductor layer 64 will likewise extend laterally past this boundary as shown in FIG. 6C. In the alternative embodiment of FIG. 5D in which the spacers 54a, 54b border the cavities 60a, 60b, the peripheral sections 66a, 66b of the semiconductor layer 64 occupy the cavities 60a, 60b as shown in FIG. 6D.

Figure 7:
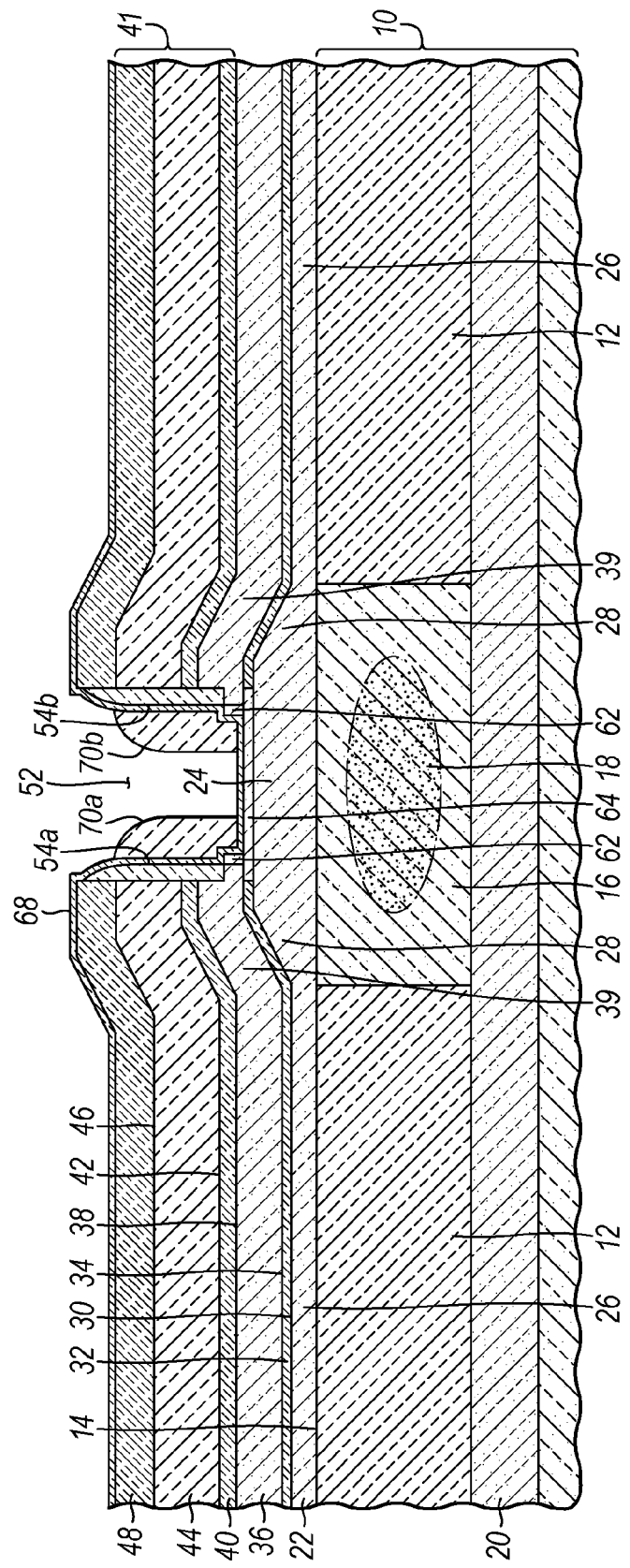

With reference to FIG. 7 in which like reference numerals refer to like features in FIG. 6 and at a subsequent fabrication stage, a layer 68 comprised of a dielectric material is conformally deposited and spacers 70a, 70b are formed on the spacers 54a, 54b with dielectric layer 68 as an intervening structure. The dielectric layer 68 may be formed from a dielectric material, such as a thin layer of $SiO_2$ like a high temperature oxide (HTO) deposited by rapid thermal process (RTP) at temperatures of 500° C. or higher. Alternatively, the dielectric layer 68 may be deposited by a different deposition process, or thermal oxidation of silicon such as oxidation at high pressure with steam (HIPOX), or a combination of above oxide formation techniques known to those of ordinary skill in the art. Spacers 70a, 70b, which are comprised of a dielectric material (e.g., $Si_3N_4$) that etches selectively to the dielectric material comprising the dielectric layer 68, may be formed by blanket layer deposition and anisotropic etching in a manner similar to spacers 54a, 54b. A portion of the dielectric layer 68 covers the top surface 63 of the semiconductor layer 64 inside the emitter opening 52. In an alternative embodiment, spacers 70a, 70b may be comprised of Si.

Figure 8:
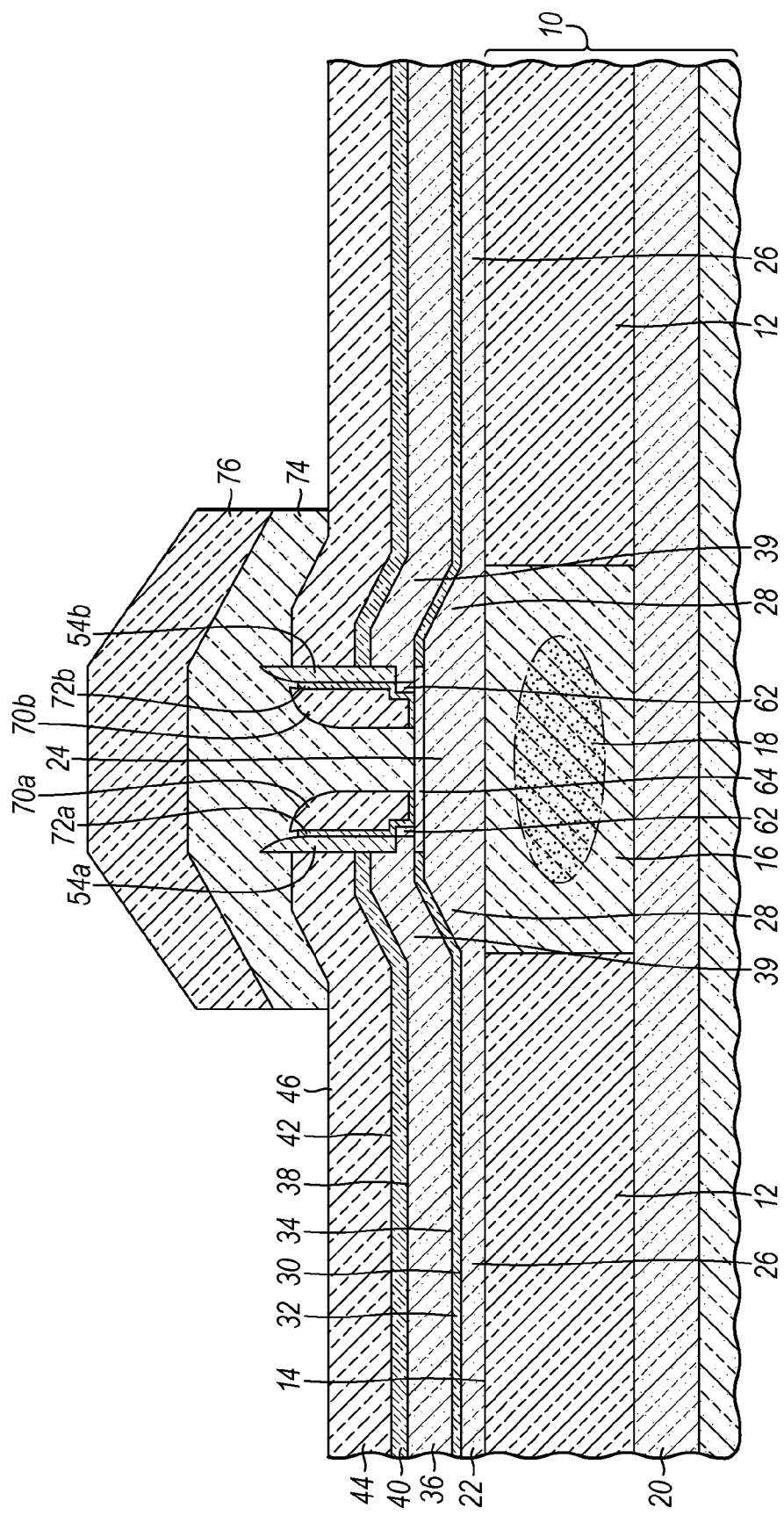

With reference to FIG. 8 in which like reference numerals refer to like features in FIG. 7 and at a subsequent fabrication stage, a top surface 63 (FIG. 6) of the semiconductor layer 64 is exposed by an etching process that removes the material of the dielectric layer 68 inside the emitter opening 52 and laterally between the dielectric spacers 70a, 70b. The etching process stops on the material constituting semiconductor layer 64 and hence terminates upon reaching the top surface 63 of semiconductor layer 64. The etching process may be chemical oxide removal (COR) that removes the material of dielectric layer 68, if comprised of $SiO_2$, with minimal undercut beneath the dielectric spacers 70a, 70b. A COR process may utilize a mixture flow of hydrogen fluoride (HF) and ammonia ($NH_3$) in a ratio of 1:10 to 10:1 and may be performed at reduced pressures (e.g., about 1 mTorr to about 100 mTorr) and at approximately room temperature. The remnant of dielectric layer 48 and portions of dielectric layer 68 residing on dielectric layer 48 are also removed by the etching process to reveal the top surface 46 of dielectric layer 44. An optional HF chemical cleaning procedure may follow the etching process. Spacers 72a, 72b are formed from portions of the dielectric layer 68 shielded during the performance of the etching process by the dielectric spacers 70a, 70b and are respectively disposed between the spacers 54a, 54b and the spacers 70a, 70b.

An emitter 74 of the bipolar junction transistor 80 is then formed inside the emitter opening 52 from a blanket layer comprised of a heavily-doped semiconductor material, such as polysilicon heavily doped with a concentration of a dopant, such as an impurities species from Group V of the Periodic Table (e.g., arsenic) effective to impart an n-type conductivity in which electrons are the majority carriers and dominate the electrical conductivity of the semiconductor material. An optional dielectric cap 76 may be formed on a head of the emitter 74 from a layer comprised of a dielectric material, such as $Si_3N_4$, which is deposited on the heavily-doped semiconductor material layer. These deposited layers are patterned with a lithography and etching process to define the emitter 74 and the dielectric cap 76 on the emitter 74. The lithography process forming emitter 74 from the layer of heavily-doped semiconductor material may utilize an etch mask to protect only a strip of the heavily-doped semiconductor material above the portion filling the emitter opening 52. A subtractive etching process with an etch chemistry stops on the material of dielectric layer 44 is selected to shape the head of the emitter 74 from the protected strip of heavily-doped semiconductor material. The etch mask may be removed from the surface after shaping the emitter 74, which re-exposes the top surface 46 of dielectric layer 44.

The extrinsic base layer 36 is self-aligned to the emitter 74. The self-alignment arises from the use of the spacers 54a, 54b to establish the lateral location for the emitter 74 relative to the extrinsic base layer 36. Spacers 54a, 54b, 70a, 70b, 72a, 72b electrically isolate the emitter 74 from the extrinsic base layer 36. Spacers 70a, 70b, 72a, 72b establish the distance between the emitter 74 and the extrinsic base layer 36.

The emitter 74 is coupled with the intrinsic base layer 22 by the semiconductor layer 64. The bottom part of the emitter 74, which is located inside the emitter opening 52, contacts the top surface 63 of the semiconductor layer 64. In one embodiment, the bottom part of the emitter 74 directly contacts the top surface 63 of the semiconductor layer 64 and indirectly contacts the top surface 30 of intrinsic base layer 22. Specifically, the emitter 74 contacts the central section 66c of the semiconductor layer 64. The head of the emitter 74 protrudes out of the emitter opening 52 and includes lateral arms that partially overlap with the top surface 46 of dielectric layer 44. The head of the emitter 74 is dimensioned to provide an overlay margin to ensure that an overlying interconnect contact lands on the emitter 74.

With reference to FIG. 9 in which like reference numerals refer to like features in FIG. 8 and at a subsequent fabrication stage, the footprint of a bipolar junction transistor 80 on substrate 10 is defined by using conventional photolithography and etching processes to pattern the layers 22, 32, 36, 40, 44. Initially, dielectric layers 40, 44 are patterned using the same etch mask used to form the emitter 74 and dielectric cap 76, or a different etch mask formed in a similar manner. An initial phase of the subtractive etching process, which may be a RIE process, with an etch chemistry that stops on the material of dielectric layer 40 and is used to trim dielectric layer 44. An etching process with a different etch chemistry that stops on the material of extrinsic base layer 36 is used to trim dielectric layer 40. The etch mask is removed after shaping the dielectric layers 40, 44. The etch mask, if comprised of photoresist, may be removed by oxygen plasma ashing or chemical stripping.

Layers 22, 32, 36 are then patterned to define an extrinsic base 82 of the bipolar junction transistor 80 from extrinsic base layer 36 and an intrinsic base 84 of the bipolar junction transistor 80 from intrinsic base layer 22. An etch mask is applied for use in a patterning process that relies on a subtractive etching process, such as a RIE process, with respective etch chemistries appropriate to etch the layers 22, 32, 36. Following the conclusion of the subtractive etching process, the etch mask is removed and, if comprised of photoresist, may be removed by oxygen plasma ashing or chemical stripping.

After patterning, the bipolar junction transistor 80 has a vertical architecture in which the intrinsic base 84 is located between the emitter 74 and the collector region 18, and the emitter 74, the raised region 24 of intrinsic base 84, and the collector region 18 are vertically arranged. In the vertical architecture of the bipolar junction transistor 80, the extrinsic base 82 is separated from the intrinsic base 84 by the base dielectric layer 32. Various contacts (not shown) are provided to the subcollector region 20, the emitter 74, and the extrinsic base 82 to provide the requisite electrical connections to the bipolar junction transistor 80.

The conductivity types of the semiconductor material constituting the emitter 74 and the semiconductor materials constituting extrinsic base 82 and intrinsic base 84 are opposite. The semiconductor material of the intrinsic base 84, which may be $Si_xGe_{1-x}$ doped with boron and/or carbon, may have a narrower band gap than the materials (e.g., silicon) of the emitter 74 and collector region 18, in which case the bipolar junction transistor 80 has a Si/SiGe heterojunction. The bipolar junction transistor 80 may comprise either an NPN device or a PNP device contingent upon the device doping.

The link supplied by semiconductor layer 64, extrinsic base 82, and intrinsic base 84 collectively present a new epitaxial base structure in which the link provides a self-aligned and reduced-parasitic linkup of the extrinsic base 82 to the intrinsic base 84 to obtain a structure for the bipolar transistor that is characterized by a high $f_{max}$. The power gain, which is typically characterized by the metric $f_{MAX}$, is an important parametric for Bipolar/BiCMOS performance. The bipolar junction transistor 80 is fabricated using a non-selective deposition of a layer (e.g., SiGe) used to form the intrinsic base 84, followed by a double poly self-aligned-like structure comprising the layer used to form the extrinsic base 82 and the semiconductor layer 64 providing the thin linkup.

In one embodiment, a non-selective epitaxial growth process, such as UHV/CVD, is used to form the semiconductor layer 64. The UHV/CVD process is characterized by a lower thermal cycle than conventional reduced-pressure epitaxial deposition techniques, which also require a prebake.

During the front-end-of-line (FEOL) portion of the fabrication process, the device structure of the bipolar junction transistor 80 is replicated across at least a portion of the surface area of the substrate 10. In BiCMOS integrated circuits, complementary metal-oxide-semiconductor (CMOS) transistors (not shown) are formed using other regions of the substrate 10. As a result, both bipolar and CMOS transistors available on the same substrate 10.

Standard back-end-of-line (BEOL) processing follows, which includes formation of contacts and wiring for the local interconnect structure, and formation of dielectric layers, via plugs, and wiring for an interconnect structure coupled by the interconnect wiring with the bipolar junction transistor 80, as well as other similar contacts for additional device structures like bipolar junction transistor 80 and CMOS transistors (not shown) included in other circuitry fabricated on the substrate 10. Other active and passive circuit elements, such as diodes, resistors, capacitors, varactors, and inductors, may be fabricated on substrate 10 and available for use in the BiCMOS integrated circuit.

Figure 10:
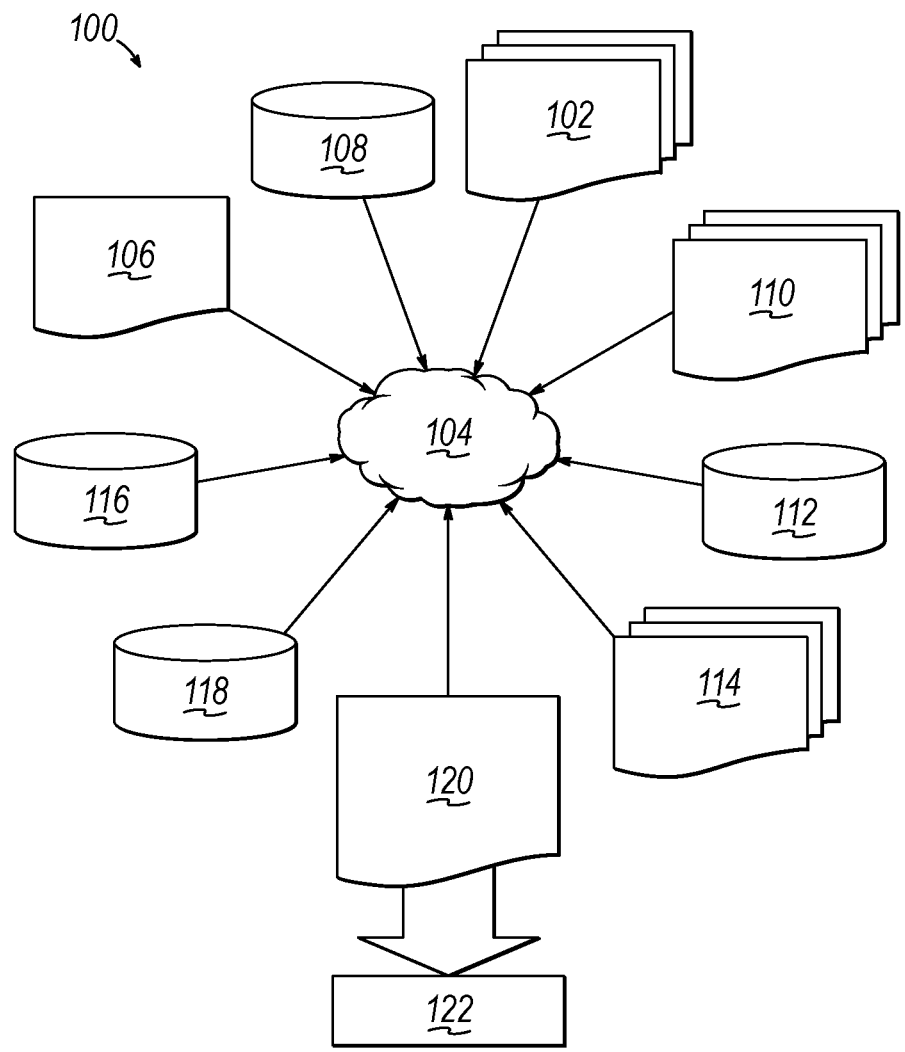
FIG. 10 is a flow diagram of a design process used in semiconductor design, manufacture, and/or test.

FIG. 10 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIG. 9. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIG. 9. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIG. 9 to generate a Netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including Netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 9. In one embodiment, design structure 120 may comprise a compiled, executable HDL simulation model that functionally simulates the devices shown in FIG. 9.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 9. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A device structure for a bipolar junction transistor, the device structure comprising:
    an intrinsic base;
    an extrinsic base;
    a dielectric layer between the intrinsic base and the extrinsic base;
    an emitter opening extending through the extrinsic base and the dielectric layer to the intrinsic base;
    a semiconductor layer that covers the intrinsic base inside the emitter opening, the semiconductor layer extending laterally relative to the emitter opening to establish a physical link between the extrinsic base and the intrinsic base; and
    an emitter disposed in the emitter opening, the emitter physically coupled by the semiconductor layer with the intrinsic base.

2. The device structure of claim 1 further comprising:
    a device region comprised of a semiconductor material and having a top surface; and
    a collector region in the device region;
    wherein the intrinsic base and the semiconductor layer are disposed on the top surface of the device region.

3. The device structure of claim 2 wherein the collector region, the intrinsic base, the semiconductor layer, and the emitter have a vertical arrangement.

4. The device structure of claim 1 wherein the extrinsic base includes a first section and a second section that is thicker than the first section, and the first section of the extrinsic base is disposed laterally between the emitter and the second section of the extrinsic base.

5. The device structure of claim 4 wherein the semiconductor layer has a top surface, and further comprising:
    a spacer lining the emitter opening and laterally positioned between the emitter and the second section of the extrinsic base, the spacer separated from the top surface of the semiconductor layer by the first section of the extrinsic base.

6. The device structure of claim 1 wherein the semiconductor layer has a top surface, and further comprising:
    a spacer lining the emitter opening and laterally positioned between the emitter and the extrinsic base, the spacer having a directly contacting relationship with the top surface of the semiconductor layer.

7. The device structure of claim 1 further comprising:
    a spacer lining the emitter opening and laterally positioned between the emitter and the extrinsic base, the spacer self-aligning the emitter with the extrinsic base.

8. The device structure of claim 1 wherein the dielectric layer includes a sidewall that is recessed laterally relative to the emitter opening so that a cavity is defined between the extrinsic base and the intrinsic base, the cavity opens into the emitter opening, and the semiconductor layer includes a peripheral section disposed within the cavity.

9. The device structure of claim 1 wherein the semiconductor layer includes a first section that is aligned with the emitter opening and that is laterally positioned between the emitter and the intrinsic base.

10. The device structure of claim 1 wherein the semiconductor layer includes a first section and a second section, the first section of the semiconductor layer is vertically disposed between the emitter and the intrinsic base, and the second section of the semiconductor layer establishes the physical link between the extrinsic base and the intrinsic base.

11. The device structure of claim 10 wherein the dielectric layer includes a sidewall that is recessed laterally relative to the emitter opening so that a cavity is defined between the extrinsic base and the intrinsic base, and the second section of the semiconductor layer is at least partially disposed within the cavity.

12. The device structure of claim 10 wherein the intrinsic base includes a raised region aligned with the emitter opening and a facet region adjoining the raised region at a boundary, and the first section of the semiconductor layer is disposed on the raised region.

13. The device structure of claim 12 wherein the second section of the semiconductor layer is disposed on the raised region.

14. The device structure of claim 12 wherein the second section of the semiconductor layer is partially disposed on the raised region and partially disposed on the facet region.

15. The device structure of claim 12 wherein the dielectric layer includes a sidewall that is recessed laterally relative to the emitter opening so that a cavity is defined between the extrinsic base and the raised region of the intrinsic base, and the second section of the semiconductor layer is at least partially disposed within the cavity.

16. The device structure of claim 1 wherein the semiconductor layer has an epitaxial relationship with a semiconductor material of the intrinsic base.

17. A hardware description language (HDL) design structure encoded on a machine-readable data storage medium, the HDL design structure comprising elements that when processed in a computer-aided design system generates a machine-executable representation of a bipolar junction transistor, the HDL design structure comprising:
    an intrinsic base;
    an extrinsic base;
    a dielectric layer between the intrinsic base and the extrinsic base;
    an emitter opening extending through the extrinsic base and the dielectric layer to the intrinsic base;
    a semiconductor layer that covers the intrinsic base inside the emitter opening, the semiconductor layer extending laterally relative to the emitter opening to establish a physical link between the extrinsic base and the intrinsic base; and
    an emitter in the emitter opening, the emitter physically coupled by the semiconductor layer with the intrinsic base.

18. The HDL design structure of claim 17 wherein the HDL design structure comprises a netlist.

19. The HDL design structure of claim 17 wherein the HDL design structure resides on storage medium as a data format used for the exchange of layout data of integrated circuits.

20. The HDL design structure of claim 17 wherein the HDL design structure resides in a programmable gate array.

\* \* \* \* \*